(12) United States Patent
Aronson et al.

(10) Patent No.: US 6,842,467 B1
(45) Date of Patent: Jan. 11, 2005

(54) FIBER OPTIC LASER TRANSMITTER WITH REDUCED NEAR END REFLECTIONS

(75) Inventors: Lewis B. Aronson, Los Altos, CA (US); Daniel S. Kane, San Francisco, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/521,639

(22) Filed: Mar. 8, 2000

(51) Int. Cl.$^7$ ................................................ H01S 3/10
(52) U.S. Cl. ............................ 372/27; 385/11; 385/35
(58) Field of Search ...................... 372/27, 6; 359/281, 359/282; 385/11, 35

(56) References Cited

U.S. PATENT DOCUMENTS

| | | | |
|---|---|---|---|
| 4,844,593 A | | 7/1989 | Parker et al. |
| 4,955,006 A | * | 9/1990 | Fukushima et al. ...... 369/13.29 |
| 5,272,351 A | | 12/1993 | Andressen |
| 5,276,701 A | | 1/1994 | Shirasaki |
| 5,303,083 A | | 4/1994 | Blanchard et al. |
| 5,375,012 A | * | 12/1994 | Borrelli et al. ............. 359/485 |
| 5,434,669 A | * | 7/1995 | Tabata et al. ............... 356/477 |
| 5,448,579 A | | 9/1995 | Chang et al. |
| 5,627,848 A | | 5/1997 | Fermann et al. |
| 5,818,626 A | | 10/1998 | Engstrom et al. |
| 6,014,359 A | * | 1/2000 | Nagano .................. 369/112.07 |
| 2002/0118904 A1 | * | 8/2002 | Man et al. ..................... 385/11 |

FOREIGN PATENT DOCUMENTS

WO  PCT/US01/06997   3/2001

* cited by examiner

Primary Examiner—Minsun Oh Harvey
Assistant Examiner—Cornelius H. Jackson
(74) Attorney, Agent, or Firm—Workman Nydegger

(57) ABSTRACT

A laser apparatus, which generates laser light to be transmitted through an optical transmission system includes a laser that emits light that is substantially linearly polarized, a housing in which the laser is mounted, and a quarter wave retarder plate. The quarter wave retarder plate is disposed so that the emitted laser light passes through the quarter wave retarder plate prior to transmission of the emitted laser light through the optical transmission system. The quarter wave retarder plate causing the emitted laser light to become circularly polarized with a predefined handedness. The quarter wave retarder plate is also disposed so that light reflected by the optical transmission system back toward the laser passes through the quarter wave retarder plate a second time prior to reaching the laser, causing the reflected light to become linearly polarized with a linear polarization that is orthogonal to the polarization state of the light emitted by the laser. In one embodiment, a linear polarizer is positioned adjacent a front face of the quarter wave retarder plate. The linear polarizer imposes a particular linear polarization orientation on the emitted laser light, and blocks the reflected light that passes through the quarter wave retarder plate because that light has a linear polarization that is orthogonal to the polarization axis of the linear polarizer.

27 Claims, 6 Drawing Sheets

FIBER OPTIC LASER TRANSMITTER WITH REDUCED NEAR END REFLECTIONS

The present invention relates generally to laser based fiber optic transmission systems, and particularly to apparatus for reducing near end reflections from the near fiber end face back into the laser cavity.

BACKGROUND OF THE INVENTION

Referring to FIG. 1, there is shown a somewhat simplified representation of a conventional laser based fiber optic transmission system 50. The transmitter's laser 52 is a diode laser that is housed in a hermetically sealed transistor outline (TO) can 54, herein called the laser housing or the TO-can. The laser housing includes a window 56 through which emitted laser light is transmitted. Typically, a thin film antireflection coating 58 is deposited on the inside surface of the window 56 to reduce reflections from the window 56, and may also include another thin film antireflection coating 60 on the outside surface of the window 56 to reduce reflections from that surface. Each of the thin film antireflection coatings 58, 60 is a conventional optical antireflection film, typically having a thickness of a quarter wave of the transmitted laser light.

The light transmitted by the laser is focused by the lens 62 onto a front end of an optical fiber 64 for transmission through the optical fiber 64 to a receiving device 66. A portion of the light transmitted by the laser 52 is reflected back toward the laser 52 by the near and far end faces of the optical fiber 64, as well as by any other optical discontinuities such as connectors. It is well known that reflections coupled back into a laser cavity cause fluctuations in both the amplitude and phase of the laser output. These fluctuations have several detrimental effects including increased relative intensity noise (RIN), increased spectral width, and increased mode partition noise (for multi-longitudinal mode lasers). In fiber optic communication systems each of these may have an adverse effect on system performance. The most notable manifestation is a reduction in fiber optic link length (i.e., the space between signal repeaters must be reduced to avoid loss of information). In some cases, however, the effects can be so profound as to prevent satisfactory performance altogether over even an arbitrarily short link.

A great deal of energy has been spent attempting to reduce unwanted reflections and their degrading effects. Lasers of all varieties including distributed feedback (DFB) lasers, Fabry-Perot (FP) lasers, and vertical cavity surface emitting lasers (VCSELs) are subject to the negative effects of reflections coupled back into the laser cavity. DFB and FP lasers used in single (spatial) mode links of up to 120 km and more are particularly susceptible. However, the present invention can be used with other types of lasers as well.

Reflections occur wherever there is a discontinuity in index of refraction (n) within an optical link. Such discontinuities generally exist wherever a fiber ends (fiber-air interface), and wherever a connector or splice introduces a slight change in index. In the case of a connectorized link (that is, a link with a removable fiber connector on either end as opposed to one where every connection is spliced) two primary reflections are from the near and far ends of the fiber. The near end reflection results from the air/fiber discontinuity where the laser light is focused onto the fiber, and the far end reflection results from the fiber/air discontinuity where the opposite end of the fiber is plugged into a receiver.

In many cases, the near end reflection dominates all others in terms of its negative effects. In such cases, schemes to reduce the near end reflections can provide sufficient optical isolation. Referring to FIG. 2, traditionally, optical isolation in a fiber optic transmission system 80 is obtained using a 45 degree Faraday rotator 82 sandwiched between two linear polarizers 84, 86 oriented at 45 degrees with respect to each other. The 45 degree Faraday rotator 82 is a magneto-optical device that uses magnetic fields to rotate the polarization state of light. The combination of the two polarizers and the Faraday rotator 82 is called an isolator.

Light propagating from the laser passes through the first polarizer 84. Its polarization state is then rotated 45 degrees by the Faraday rotator 82 so that it is parallel to the second polarizer 86. Reflected light traversing the isolator in the opposite direction, however, is first polarized by the polarizer 86 farthest from the laser. It is then rotated, by the Faraday rotator 82, 45 degrees in the same direction as if it were traversing forward through the Faraday rotator 82. The resulting polarization state is thus perpendicular to the orientation of the polarizer 84 closest to the laser 52 and therefore the reflected light is blocked. Such isolators 82, 84, 86 block all reflected light. They are essentially optical one way valves. They are extremely effective, but are also very expensive. In particular, the inclusion of the Faraday rotator 82 greatly increases the cost of the transmitter.

Another method to reduce near end reflections is shown in FIG. 3. FIG. 3 shows more of the details of a typical laser transmitter housing. This same style of housing may be used in all of the prior art transmitters as well as in the transmitters of the present systems. Since the additional details of the transmitter systems shown in FIG. 3 are not relevant to the present invention, they are not repeated in the other figures.

In the system shown in FIG. 3, the transmitter 90 contains a short length of optical fiber 92, herein called a fiber stub, that has an angled endface 94 at the end closer to the laser 52. The laser and lens are arranged such that the light from the laser is coupled efficiently into the angled end 94 of the fiber stub 92. The angled endface 94 eliminated reflection from that surface by directing the reflection away from the laser. At the other end 96 of the fiber stub 92, reflections are reduced by relying on physical contact between fiber stub and the external fiber 64 of the transmission system. The system shown in FIG. 3 has a few notable weaknesses. First and foremost, the system relies on perfect physical contact between the fiber stub 92 and the user's optical fiber 64. Even a microscopic particle on the surface of the fiber stub 92, which is usually inconvenient to clean, will eliminate physical contact and result in reflections as sever as in the uncorrected system shown in FIG. 1. Secondly, the cost of the fiber stub 92 is often significant. Finally, in some situations, the extra length imposed by the fiber stub is a significant disadvantage.

SUMMARY OF THE INVENTION

In summary, the present invention is a laser apparatus that either blocks light transmitted by a laser from being reflected back into the laser cavity, or conditions the reflected light to a linear polarization state that does not interfere with operation of the laser.

The laser apparatus, which generates laser light to be transmitted through an optical transmission system includes a laser that emits light that is substantially linearly polarized, a housing in which the laser is mounted, and a quarter wave retarder plate. The quarter wave retarder plate is disposed so that the emitted laser light passes through the quarter wave retarder plate prior to transmission of the emitted laser light through the optical transmission system. The quarter wave retarder plate causes the emitted laser light to become circularly polarized with a predefined handedness. The quarter wave retarder plate is also disposed so that light reflected by the optical transmission system back toward the laser passes through the quarter wave retarder plate a second time prior to reaching the laser, causing the reflected light to become linearly polarized with a linear polarization that is orthogonal to the polarization state of the light emitted by the laser.

In one embodiment, a linear polarizer is positioned between the laser and the quarter wave retarder plate. The linear polarizer imposes a particular linear polarization orientation on the emitted laser light, and blocks the reflected light that passes through the quarter wave retarder plate because that light has a linear polarization that is orthogonal to the polarization axis of the linear polarizer.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
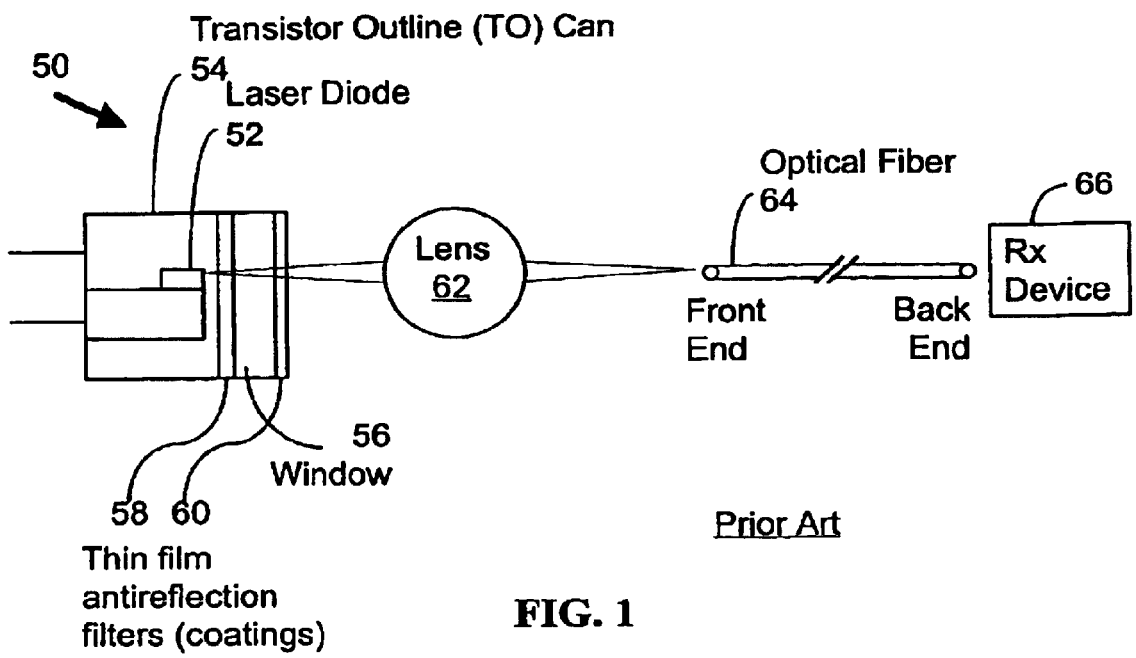
FIG. 1 depicts a laser transmitting light into an optical fiber.
Figure 2:
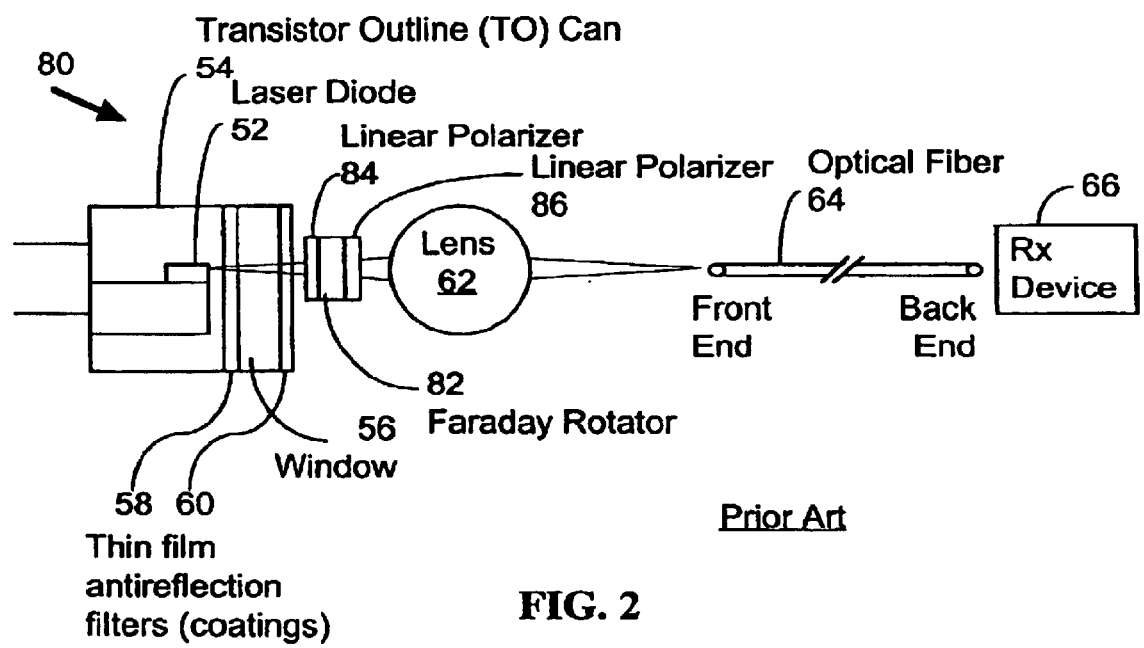
FIG. 2 depicts a laser to fiber connection with a prior art near end reflection reduction apparatus.
Figure 3:
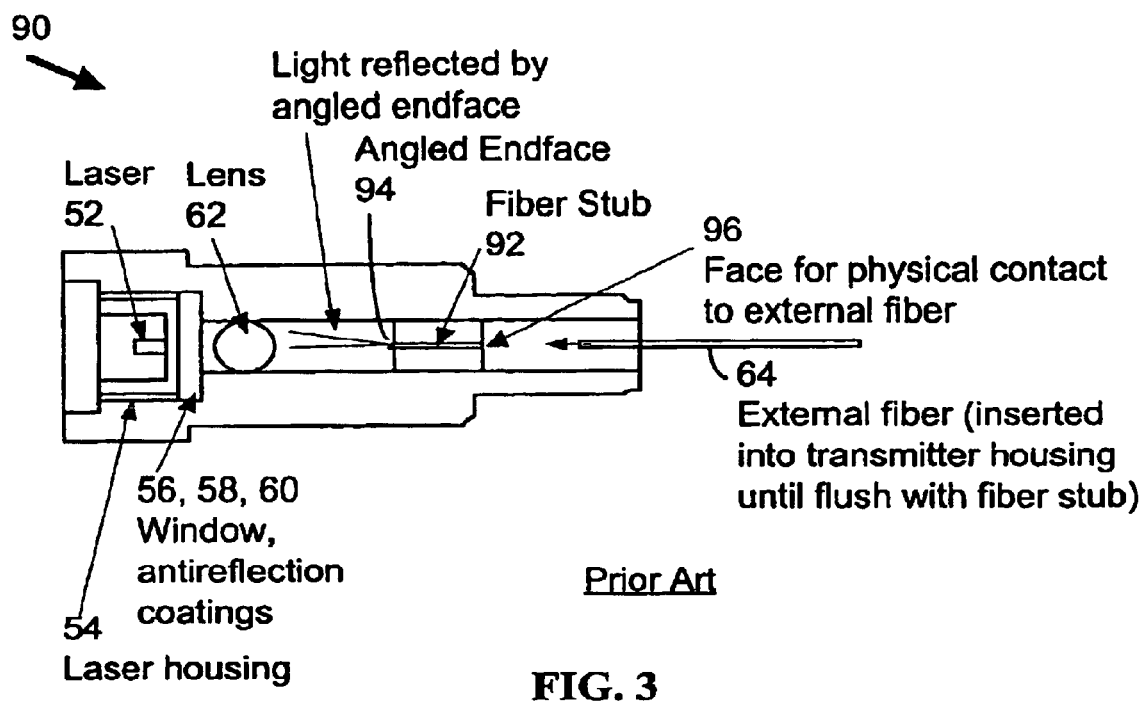
FIG. 3 depicts another laser to fiber connection with a second prior art near end reflection reduction apparatus.
Figure 4:
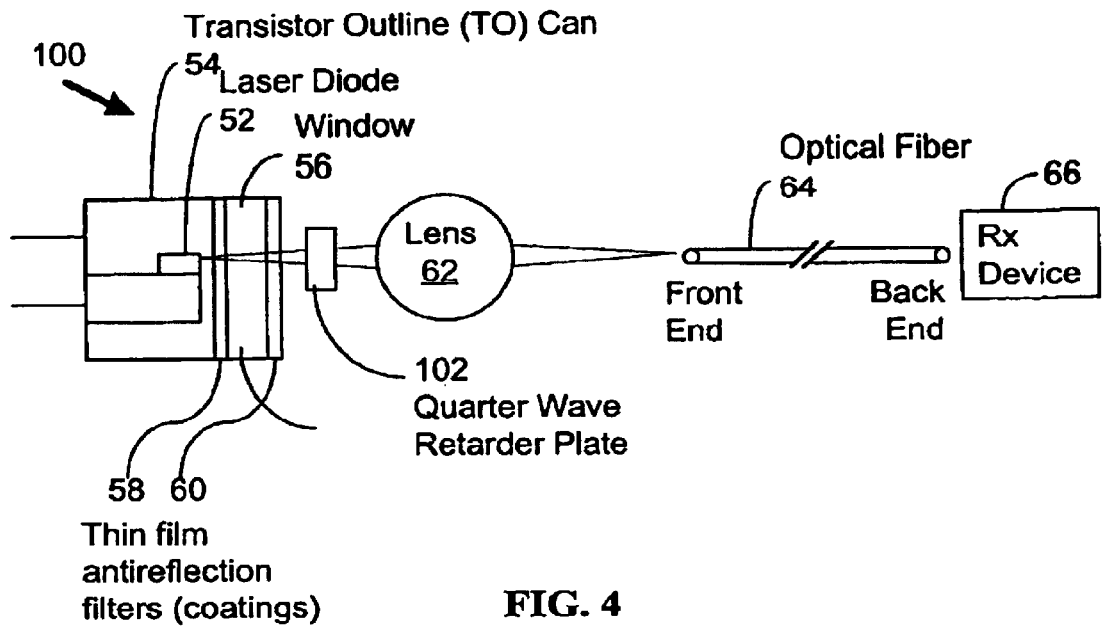
FIG. 4 depicts a first embodiment of a laser to fiber connection with near end reflection reduction apparatus in accordance with the present invention.
Figure 5:
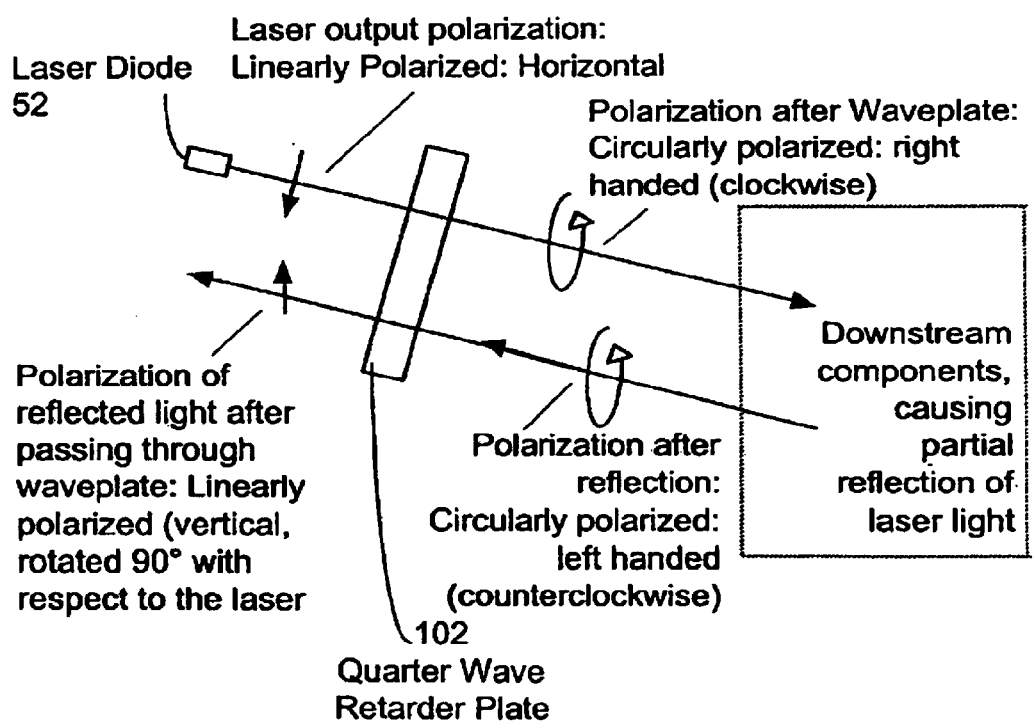
FIG. 5 depicts the polarization of laser light at various positions in the system shown in FIG. 4.

Referring to FIGS. 4 and 5, there is shown a laser based fiber optic transmission system 100 having a diode laser 52 that is housed in a hermetically sealed transistor outline (TO) can 54, herein called the laser housing or the TO-can. The laser housing includes a window 56 through which the emitted laser light is transmitted. In a preferred embodiment, there is a thin film antireflection coating 58 on the inside surface of the window 56 to reduce reflections from the window 56 and another thin film antireflection coating 60 is on the outside surface of the window 56 to reduce reflections from that surface. Each of the thin film antireflection coatings 58, 60 is a conventional optical antireflection film, typically having an optical thickness of a quarter wave of the transmitted laser light.

While the laser housing 54 typically is a hermetically sealed housing that has a window 56 through which the emitted laser light is transmitted, but the hermetic seal and window are not essential elements of the present invention.

The light transmitted by the laser 52 is focused by the lens 62 onto the front end of an optical fiber 64 for transmission through the optical fiber 64 to a receiving device 66. A portion of the light transmitted by the laser 52 is reflected back toward the laser 52 by the near and far end faces of the optical fiber 64, as well as by other optical discontinuities such as connectors.

A quarter wave retarder plate 102 is positioned in the light path between the laser 52 and the lens 64. More generally, the quarter wave retarder plate 102 can be placed anywhere between the laser and the end of the fiber 64 responsible for the near end reflection. However, it is typically easiest to mount the quarter wave retarder plate 102 between the laser 52 and the lens 62, because the optical fiber 64 is typically removable while the lens is typically permanently mounted at a fixed location with respect to the laser 52.

The quarter wave retarder plate 102 can be made of crystal, polymer or other material. It can a, also be a higher order wave plate, although higher order wave plates have the disadvantage of being less tolerant of non-normal incident light. A quarter wave retarder plate 102 is an optical system component that is well known to those skilled in the art of designing optical systems. A quarter wave retarder plate differentially retards light passing through it, in either direction, by an odd number (e.g, 1, 3 or 5) of quarter wavelengths. The retarder plate has two principal axes, called slow and fast The retarder plate can be thought of as resolving a light beam passing through it into two polarized components, with the component parallel to the slow axis lagging the one parallel to the fast axis by an odd number of wavelengths, and then recombining the two to form a single emerging beam. When the light beam entering the retarder plate is linearly polarized at 45 degrees to the fast and slow axes, the light that emerges from the retarder plate is circularly polarized.

The light emitted by the diode laser 52, which is preferably a DFB or FP laser, is linearly polarized to a very high degree. The polarized light from the laser 52 passes through the quarter wave retarder plate 102, which is oriented so that its fast axis is oriented at 45 degrees in either direction with respect to the polarization of the incident light. The linearly polarized light passing through the quarter wave plate 102, oriented as described above, emerges as either left or right handed circularly polarized light. The resulting light is focused by the lens 62 onto the front end of the fiber 64. A large portion of the laser light is transmitted through the optical fiber 64, while a smaller portion of the laser light is reflected by the front end of the optical fiber 64.

When circularly polarized light is reflected from a surface such as the front end of the optical fiber 64, the handedness of the light's circular polarization flips from left to right or vice versa. As a result, laser light reflected by the front end of the optical fiber and transmitted back through the lens toward the laser 52 has the opposite handedness of the laser light which is traveling from the laser 52 toward the front end of the optical fiber 64.

When the reflected circularly polarized light passes through the quarter wave retarder plate 102 a second time, the circularly polarized light is converted back to linearly polarized light. However, the polarization state of the reflected light is now oriented orthogonal to the original polarization state of the transmitted laser light. Light of orthogonal polarization does not couple back into the laser's oscillation mode, and so it has none of the detrimental effects described above, in the Background of The Invention section of this document. In this first embodiment the reflected light is not blocked. Rather, the reflected light is manipulated into a polarization state that does not couple back into the laser's oscillation mode.

Figure 6:
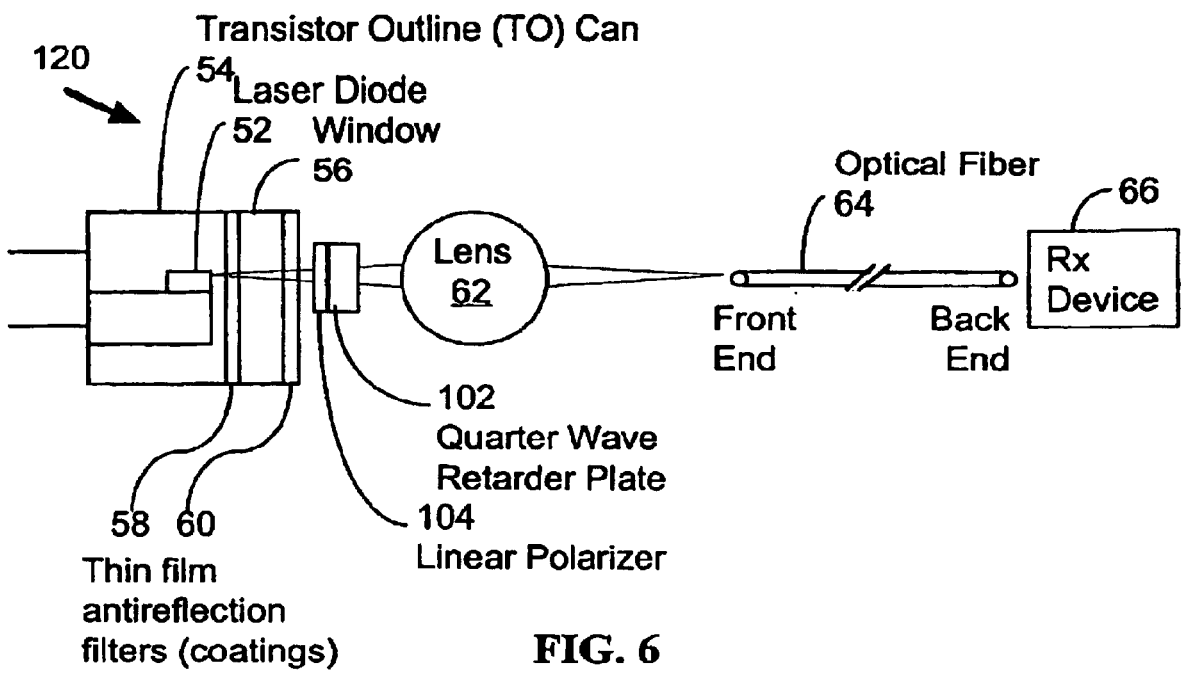
FIG. 6 depicts a second embodiment of a laser to fiber connection with near end reflection reduction apparatus in accordance with the present invention.

FIG. 6 shows a second laser based fiber optic transmission system 120 that implements a second embodiment of the present invention. Only those aspects of system 120 that differ from system 100 shown in FIG. 4 will be described.

In this second embodiment, there is a linear polarizer 104 on (i.e., adjacent to) the front face of the quarter wave retarder plate 102 (i.e., on the face closest to the laser 52). Light from the laser 52, which is generally already linearly polarized, passes through the linear polarizer 104 before passing through the quarter wave retarder plate 102. When the light from the laser 52 is traveling from the laser 52 to the lens, the only effect of the linear polarizer is to impose a particular linear polarization on the light from the laser 52. The quarter wave retarder plate 102, as before, causes the laser light traveling toward the lens 62 to become circularly polarized.

As in the first embodiment, light reflected by the front end of the optical fiber 64 is circularly polarized, but with the opposite handedness of the light traveling from the laser toward the front end of the optical fiber 64. When this reflected light passes through the quarter wave retarder plate 102 a second time (i.e., while traveling back toward the laser 52), the light becomes linearly polarized, but with a polarization that is orthogonal to the polarization of the linear polarizer 104. As a result, the reflected light is blocked by the linear polarizer 104. This second embodiment of the present invention is useful in any system where the polarization state of the laser light remains unchanged between the lens 62 and the face of the till optical fiber that is responsible for the near end reflection.

The second embodiment has several possible advantages over the first embodiment. First, the addition of a polarizer would be essential in any laser transmitter with an unpolarized output. Second, the added polarizer blocks any near end reflection from returning to the laser, which would be necessary if the laser was adversely affected by light not in the u, oscillating mode. Finally, for manufacturing reasons, it may be easier to align the polarizer more accurately to the quarter wave retarder plate, for example if the polarizer and quarter wave retarder plate (sometimes called a waveplate for convenience) are laminated together in large sheets, than it is to align a quarter wave retarder plate to the polarization axis of the laser. The combined polarizer/waveplate would be much less sensitive to angular misalignment to the laser than would a separate waveplate.

Figure 7A:
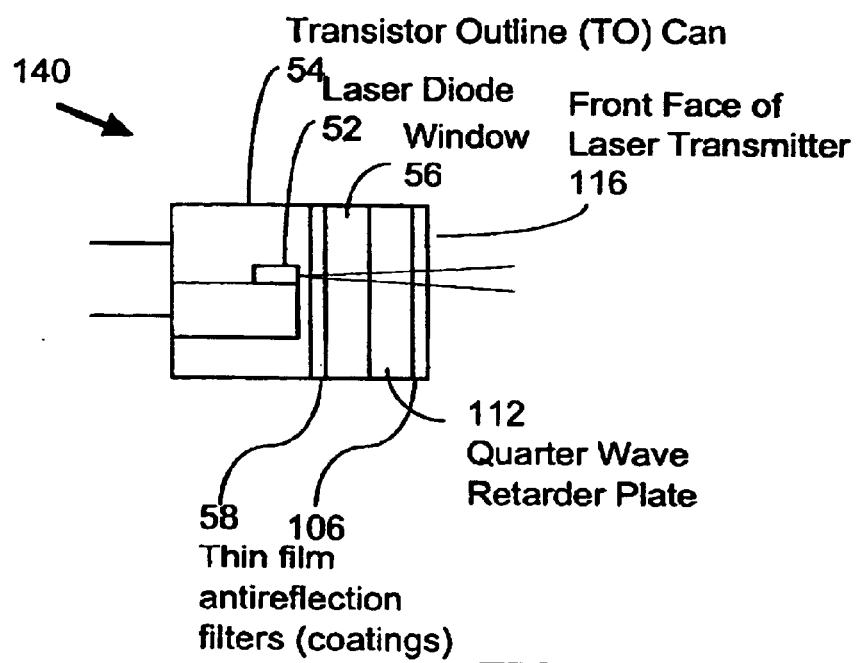
FIGS. 7A, 7B, 7C and 7D depict first, second, third and fourth embodiments, respectively, of a laser transmitter apparatus in accordance with the present invention.

FIG. 7A depicts a first embodiment of a laser transmitter apparatus 140 in accordance with the present invention. In this embodiment, a quarter wave retarder plate 112 forms part of the TO-can 54 housing of the laser diode 52. In particular, the quarter wave retarder plate 112 may be positioned after the TO-can window 56, as shown in FIG. 7A, so that light from the laser 52 traverses the quarter wave retarder plate 112 after passing through the window 56. The quarter wave retarder plate 112 is oriented so that its fast axis is oriented 45 degrees with respect to the polarization of the incident light from the laser 52.

Alternately, the quarter wave retarder plate 112 can be positioned before the TO-can window so that light from the laser 52 traverses the quarter wave retarder plate 112 before passing through the window 56. As shown in FIG. 7C, the quarter wave retarder plate 112 can be fashioned to act as (i.e., form) the TO-can window of a laser transmitter 170. The quarter wave retarder plate can also be placed between the lens 62 and the external fiber 64 of the optical transmission system, as shown in FIG. 7D. In any such position, the quarter wave retarder plate 112 performs the same function and works in the same way as the embodiment shown in FIG. 4. In particular, as the linearly polarized light transmitted by the laser diode 52 passes through the quarter wave plate 112, oriented as described above, emerges as either left or right handed circularly polarized light.

Assuming that the system in which the laser transmitter apparatus 140 is used does not have any devices between the laser transmitter 140 and the optical fiber into which light from the laser transmitter is injected, that change the polarization state of the transmitted light, then any light reflected by the front end of the optical fiber (or any other device or interface, not shown) back into the laser transmitter 140 will have circular polarization of the opposite handedness of the light originally transmitted by the laser transmitter 140.

When the reflected circularly polarized light passes through the quarter wave retarder plate 112 a second time, the circularly polarized light is converted back to linearly polarized light. As in the embodiment shown in FIG. 4, the polarization state of the reflected light is now oriented orthogonal to the original polarization state of the transmitted laser light. Light of orthogonal polarization does not couple back into the laser's oscillation mode, and so it has none of the detrimental effects described above, in the Background of The Invention section of this document. In this embodiment, reflected light is not blocked. Rather, it is manipulated into a polarization state that does not couple back into the laser's oscillation mode.

Figure 7B:
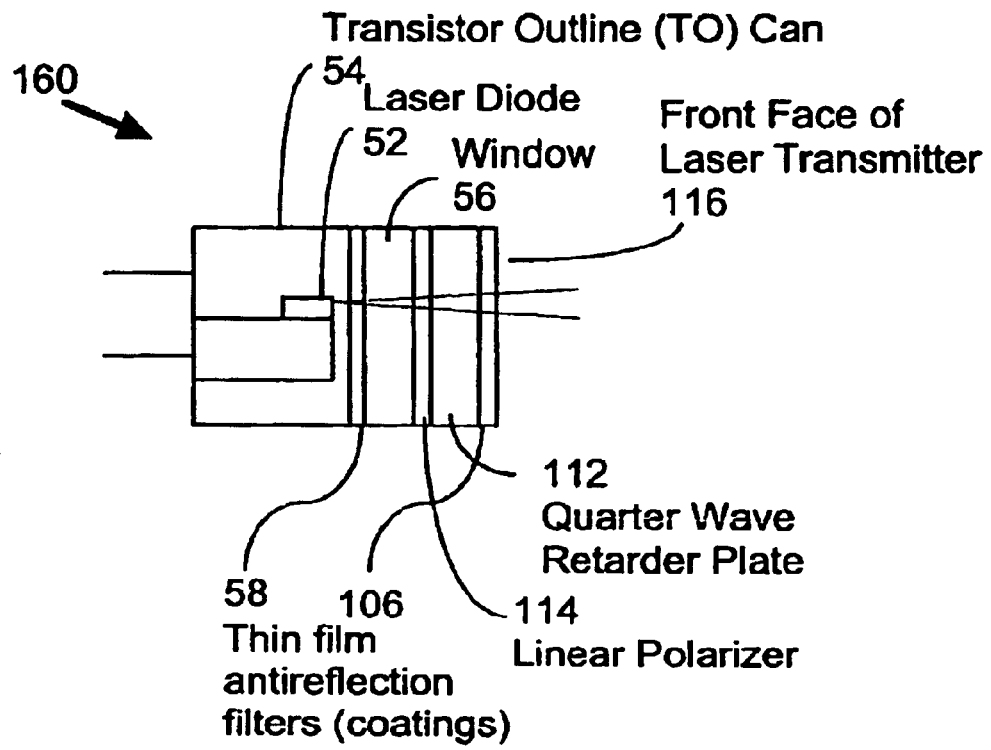
Figure 7C:
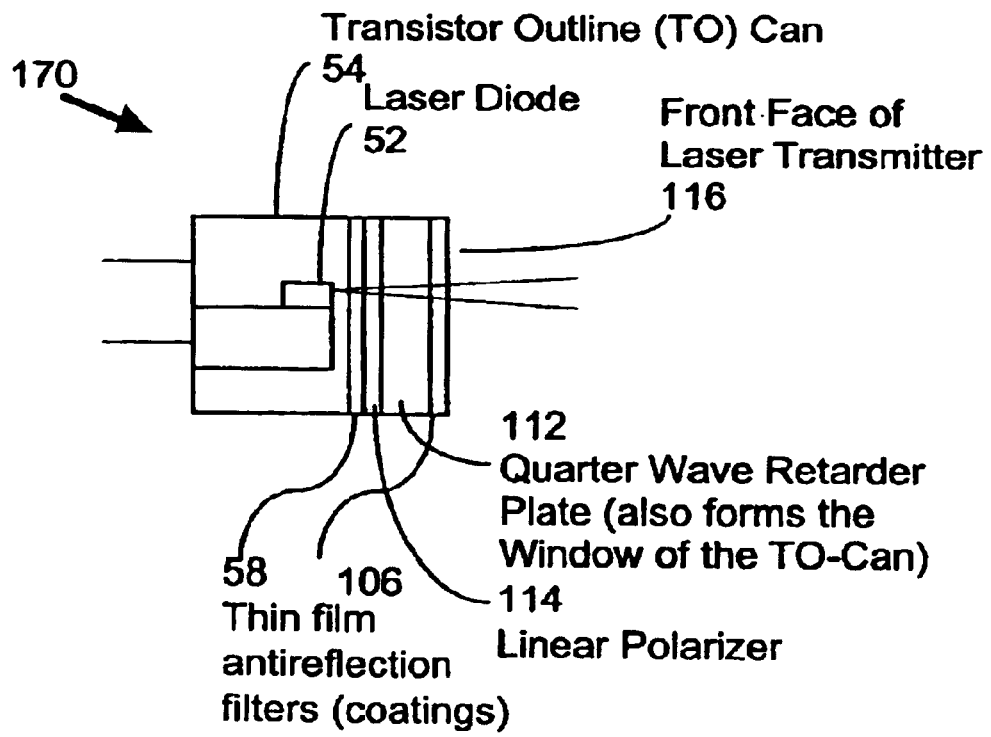
Figure 7D:
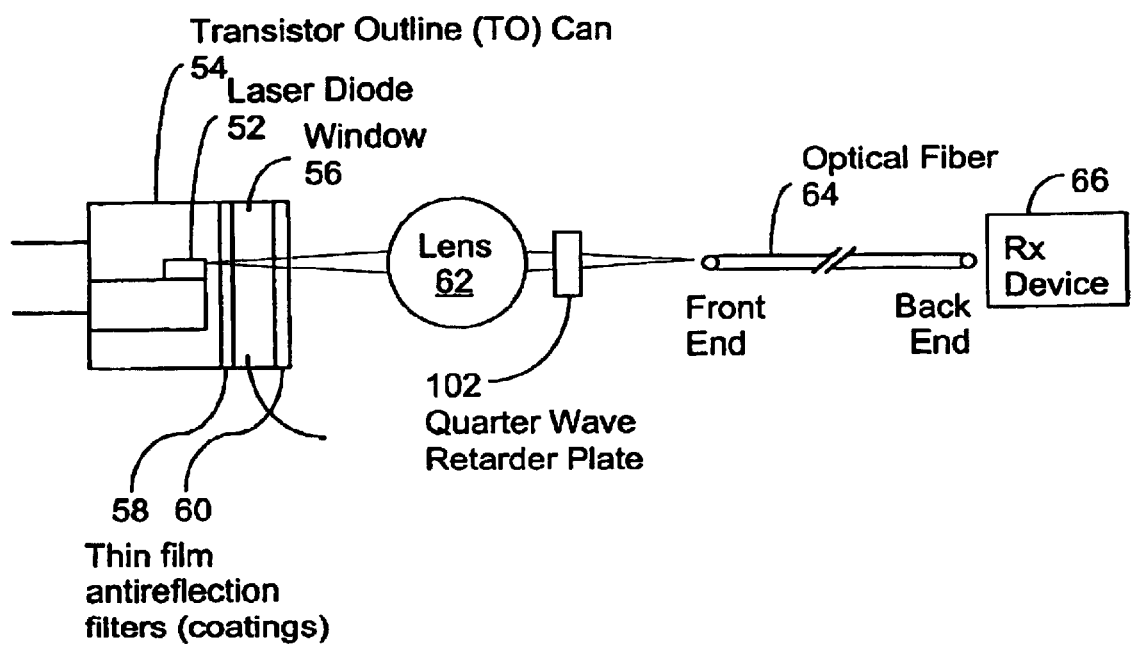

FIG. 7B depicts a second embodiment of a laser transmitter apparatus 160 in accordance with the present invention. Only those aspects of the laser transmitter 160 that differ from the laser transmitter 120 shown in FIG. 7A will be described. In this embodiment, there is a linear polarizer 114 on (i.e., adjacent to) the front end of the quarter wave retarder plate 112 facing the laser. The polarizer 114 and the plate 112 are positioned between the window 56 and the front face 116 of the laser transmitter 160. Alternately, the quarter wave retarder plate 112 and the polarizer 114 can be positioned between the laser 52 and the TO-can window so that light from the laser 52 traverses the linear polarizer 114, and then the quarter wave retarder plate 112 before passing through the window 56.

Light from the laser 52, which is generally already linearly polarized, passes through the linear polarizer 114 before passing through the quarter wave retarder plate 112. The linear polarizer 114 imposes a particular linear polarization on the light emitted from the laser 52. The quarter wave retarder plate 112, as before, causes the laser light traveling from the laser 52 toward the front face 116 of the laser transmitter 140 to become circularly polarized with a particular, predefined handedness.

As in the embodiment of FIG. 7A, light reflected by the front end of an optical fiber (not shown) or any other device back into the laser transmitter 160 is circularly polarized, but with the opposite handedness of the light traveling from the laser 52 toward the front face 116 of the laser transmitter 160. When this reflected light passes through the quarter wave retarder plate 112 a second time (i.e., while traveling back toward the laser 52), the light becomes linearly polarized, but with a polarization that is orthogonal to the polarization of the linear polarizer 114. As a result, the reflected light is blocked by the linear polarizer 114.

The linear polarizer 114 can optionally be added to the systems shown in FIGS. 7C and 7D, while in other embodiments of the systems of FIGS. 7C and 7D the linear polarizer is not included.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A laser apparatus for generating laser light to be transmitted through an optical transmission system, comprising:
   a laser that emits light that is substantially linearly polarized when in use;
   a quarter wave retarder plate that is positioned with respect to the laser so that:
      light emitted by the laser is circularly polarized by the wave reader plate so as to have a predetermined handedness before reaching an optical transmission system; and
      light reflected back toward the laser has a linear polarization, after passing through the quarter wave retarder plate a second time, eat is orthogonal to the linearly polarized light emitted by the laser; and
   a linear polarizer that is positioned between the laser and the quarter wave retarder plate so as to:
      permit the linearly polarized light emitted by the laser to pass through the linear polarizer; and
      block light reflected back toward the laser by the optical transmission system that has a linear polarization that is orthogonal to the linearly polarized light emitted by the laser.

2. The laser apparatus as recited in claim 1, wherein the linear polarizer is disposed adjacent to a surface of the quarter wave retarder plate facing the laser.

3. The laser apparatus as recited in claim 1, further comprising a lens that is positioned so that the quarter wave retarder plate is disposed between the lens and the laser.

4. The laser apparatus as recited in claim 1, further comprising a lens that is positioned between the quarter wave retarder plate and the laser.

5. The laser apparatus as recited in claim 1, further comprising a hermetically scaled housing within which the laser is disposed, the housing having a window through which the light emitted by the laser is transmitted.

6. The laser apparatus as recited in claim 5, further comprising a thin film antireflective coating on at least one surface of the window.

7. The laser apparatus as recited in claim 5, the quarter wave retarder plate comprising a portion of the hermetically sealed housing.

8. The laser apparatus as recited in claim 7, the quarter wave retarder plate comprising the window of the hermetically sealed housing.

9. The laser apparatus as recited in claim 7, further comprising a thin film antireflective coating on a surface of the quarter wave retarder plate.

10. A laser apparatus for generating laser light to be transmitted through an optical transmission system, comprising:
   a laser that emits light that is substantially linearly polarized when in use, the laser having an oscillation mode;
   a quarter wave retarder plate that is positioned with respect to the laser so that:
      light emitted by the laser is circularly polarized by the wave retarder plate so as to have a predetermined handedness before reaching an optical transmission system; and
      light reflected back toward the laser has a linear polarization, after passing through the quarter wave retarder plate a second time, that is orthogonal to the linearly polarized light emitted by the laser;
   wherein the laser apparatus does not include any polarizing element positioned between the laser and the quarter wave retarder plate so that light reflected back toward the laser that has a linear polarization that is orthogonal to the linearly polarized light emitted by the laser continues toward the laser unimpeded by any polarizing element but does not couple back onto the oscillation mode of the laser.

11. The laser apparatus as recited in claim 10, further comprising a lens that is positioned so that the quarter wave retarder plate is disposed between the lens and the laser.

12. The laser apparatus as recited in claim 10, further comprising a lens that is positioned between the quarter wave retarder plate and the laser.

13. The laser apparatus as recited in claim 10, further comprising a hermetically sealed housing within which the laser is disposed, the housing having a window through which the light emitted by the laser is transmitted.

14. The laser apparatus as recited in claim 13, further comprising a thin film antireflective coating on at least one surface of the window.

15. The laser apparatus as recited in claim 13, the quarter wave retarder plate comprising a portion of the hermetically seated housing.

16. The laser apparatus as recited in claim 15, the quarter wave retarder plate comprising the window of the hermetically sealed housing.

17. The laser apparatus as recited in claim 15, further comprising a thin film antireflective coating on a surface of the quarter wave retarder plate.

18. A light emission and transmission system, comprising:
   a laser that emits light that is substantially linearly polarized when in use, the laser having an oscillation mode;
   an optical fiber positioned relative to the laser so that at least a majority of the light emitted by the laser is transmitted away from the laser; and
   a quarter wave retarder plate positioned with respect to the laser so that:
      light emitted by the laser is circularly polarized by the wave retarder plate so as to have a predetermined handedness before reaching the optical fiber; and
      light reflected back toward the laser by the optical fiber has a linear polarization, after passing through the quarter wave retarder plate a second time, that is orthogonal to the linearly polarized light emitted by the laser so as to not couple back onto the oscillation mode of the laser.

19. A light emission and transmission system as recited in claim 18, further comprising a lens positioned between the quarter wave retarder plate and the optical fiber.

20. A light emission and transmission system as recited in claim 18, further comprising a lens that is positioned between the quarter wave retarder plate and the laser.

21. A light emission and transmission system as recited in claim 18, further comprising a linear polarizer positioned between the laser and the quarter wave retarder plate so as to:
   permit linearly polarized light emitted by the laser to pass therethrough; and
   block light reflected back toward the laser by the optical fiber that has a linear polarization that is orthogonal to the linearly polarized light emitted by the laser.

22. A light emission and transmission system as recited in claim 21, wherein the linear polarizer is disposed adjacent to a surface of the quarter wave retarder plate facing the laser.

23. A light emission and transmission system as recited in claim 18, further comprising a hermetically sealed housing within which the laser is disposed, the housing having a window through which the light emitted by the laser is transmitted.

24. A light emission and transmission system as recited in claim 23, further comprising a thin film antireflective coating on at least one surface of the window.

25. A light emission and transmission system as recited in claim 23, the quarter wave retarder plate comprising a portion of the hermetically sealed housing.

26. A light emission and transmission system as recited in claim 25, the quarter wave retarder plate comprising the window of the hermetically sealed housing.

27. A light emission and transmission system as recited in claim 25, further comprising a thin film antireflective coating on a surface of the quarter wave retarder plate.

* * * * *

UNITED STATES PATENT AND TRADEMARK OFFICE
CERTIFICATE OF CORRECTION

PATENT NO. : 6,842,467 B1
DATED : January 11, 2005
INVENTOR(S) : Lewis B. Aronson and Daniel S. Kane It is certified that error appears in the above-identified patent and that said Letters Patent is hereby corrected as shown below:

Column 1,
Line 48, after "systems" insert -- , --.

Column 4,
Line 16, remove "a,".

Column 5,
Line 12, after "lens" insert -- 62 --.
Line 38, remove "u,".

Column 7,
Line 15, change "reader" to -- retarder --.
Line 20, change "eat" to -- that --.
Line 40, change "scaled" to -- sealed --.

Column 8,
Line 27, change "seated" to -- sealed --.

Signed and Sealed this

Twenty-ninth Day of November, 2005

JON W. DUDAS
*Director of the United States Patent and Trademark Office*